(12) United States Patent
Chang et al.

(10) Patent No.: US 8,242,570 B2
(45) Date of Patent: Aug. 14, 2012

(54) TRUSS STRUCTURE AND MANUFACTURING METHOD THEREOF

(75) Inventors: Pin Chang, Hsinchu (TW); Chin-Hung Wang, Hsinchu (TW); Chia-Yu Wu, Hsinchu (TW); Jien-Ming Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 194 days.

(21) Appl. No.: 12/469,079

(22) Filed: May 20, 2009

(65) Prior Publication Data

US 2010/0148287 A1   Jun. 17, 2010

(30) Foreign Application Priority Data

Dec. 12, 2008   (TW) .............................. 97148636 A

(51) Int. Cl.
*G01L 9/00*   (2006.01)

(52) U.S. Cl. ........ 257/419; 257/204; 257/208; 257/295; 257/307; 257/421

(58) Field of Classification Search ........................ None
See application file for complete search history.

(56) References Cited

U.S. PATENT DOCUMENTS

| | | | |
|---|---|---|---|
| 5,870,482 A | 2/1999 | Loeppert et al. | |
| 5,918,110 A * | 6/1999 | Abraham-Fuchs et al. | .... 438/48 |
| 6,168,906 B1 | 1/2001 | Bernstein et al. | |
| 6,246,118 B1 * | 6/2001 | Buynoski | ...... 257/758 |
| 2007/0099031 A1 * | 5/2007 | Chung et al. | .................. 428/815 |
| 2007/0286438 A1 | 12/2007 | Hirade et al. | |

* cited by examiner

*Primary Examiner* — Kyoung Lee

(74) *Attorney, Agent, or Firm* — Allen, Dyer, Doppelt, Milbrath & Gilchrist, P.A

(57) ABSTRACT

A truss structure is provided. The truss structure comprises a substrate; and plural sub-truss groups disposed on the substrate, wherein each sub-truss group comprises plural VIAs; and plural metal layers interlaced with the plural VIAs, wherein the plural sub-truss groups are piled up on each other to form a 3-D corrugate structure.

8 Claims, 5 Drawing Sheets

TRUSS STRUCTURE AND MANUFACTURING METHOD THEREOF

TECHNICAL FIELD

The present disclosure relates to a truss structure and the manufacturing method thereof, and more particular to a truss structure and the manufacturing method thereof for releasing stress.

BACKGROUND

Due to the fashion trend, the electronic products such as the mobile phone, the portable multi-media player and the personal guiding device, are developed to be smaller, thinner and efficient, so the system integration and wireless for the electronic products will be unavoidable. Accordingly, the manufacturers will not only take more efforts in the industrial design, but also require that the semiconductor chip should have the characteristics of small volume, highly integrated functions, lower power consumption and lower cost. Moreover, the three-dimensional IC will be the next trend, in which the inner link paths are shorter to achieve the faster transmission speed, the smaller noise and the better efficiency between chips. Therefore, many technical manufacturers take efforts to investigate the three-dimensional IC for meeting the market needs.

However, in the semiconductor manufacturing, no matter the CMOS or the MEMS process is used, for the MEMS devices, there is enormous influence of performance caused by residual stress on fabricated microstructure. If the residual stress from the process could be released, the performance, the quality and the reliability of the MEMS devices will be improved.

SUMMARY

In accordance with an aspect of the present disclosure, a truss structure is provided. The truss structure includes a substrate and plural sub-truss groups disposed on the substrate, wherein each sub-truss group comprises plural VIAs; and plural metal layers interlaced with the plural VIAs, wherein the plural sub-truss groups are piled up on each other to form a three-dimension corrugate structure.

In accordance with another aspect of the present disclosure, a method for manufacturing a truss structure is provided. The method comprises steps of providing a substrate; providing plural masks; and respectively forming plural VIAs and plural metal layers on the substrate by using the plural masks, wherein the plural VIAs and the plural metal layers are piled up to form plural truss structure layers.

DETAILED DESCRIPTION

The present disclosure will now be described more specifically with reference to the following exemplary embodiments. It is to be noted that the following descriptions of exemplary embodiments are presented herein for purposes of illustration and description only; it is not intended to be exhaustive or to be limited to the precise form disclosed.

Figure 1A:
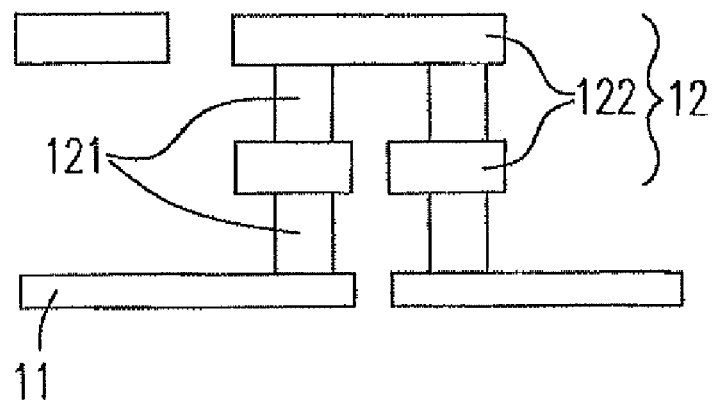
FIG. 1A is a diagram showing the unit structure according to one exemplary embodiment.
Figure 1B:
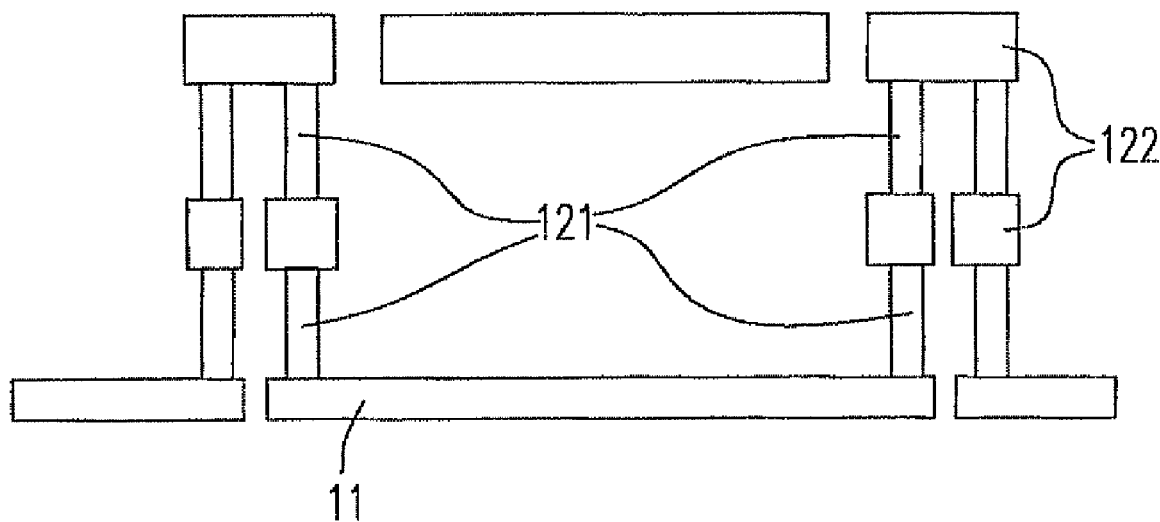
FIG. 1B is a diagram showing the 3-D corrugate structure according to one exemplary embodiment.
Figure 2A:
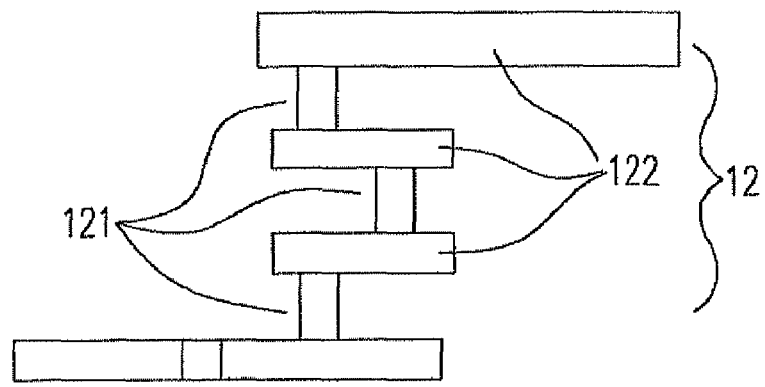
FIG. 2A is a diagram showing the unit structure according to another exemplary embodiment.
Figure 2B:
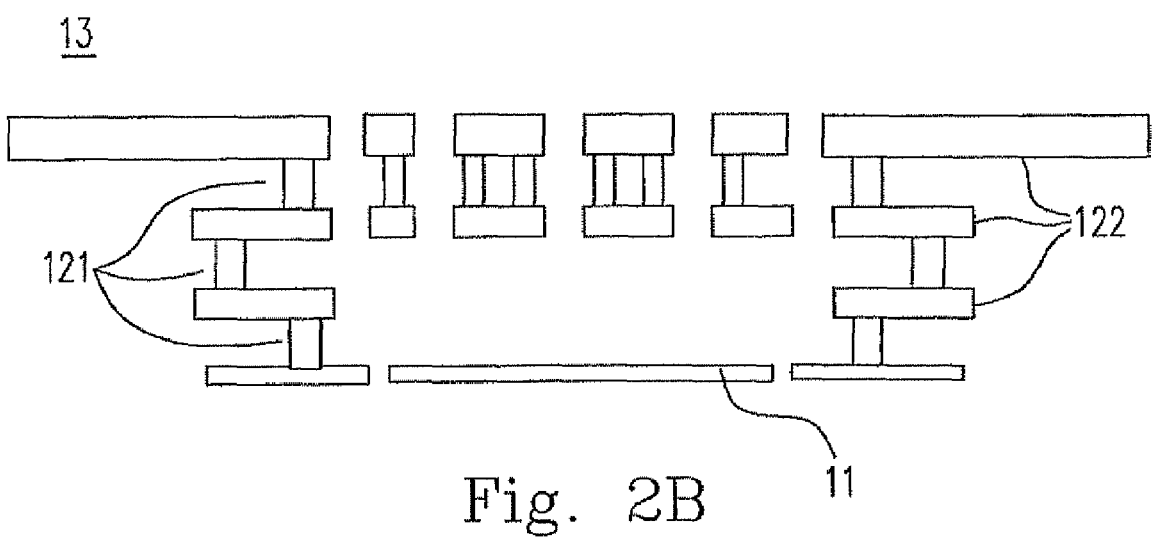
FIG. 2B is a diagram showing the 3-D corrugate structure according to another exemplary embodiment.
Figure 3A:
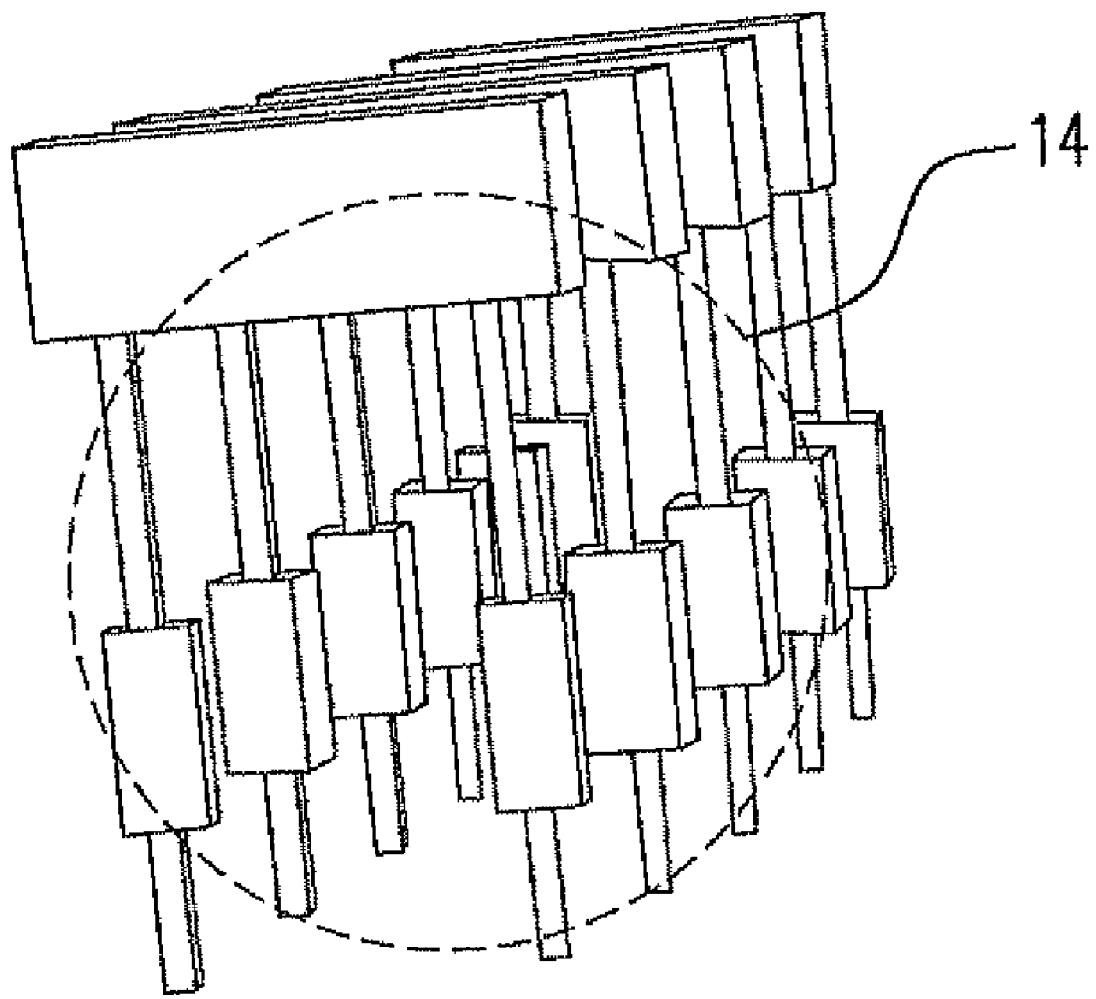
FIG. 3A is a diagram showing the individual supporting structure formed in the present disclosure.
Figure 3B:
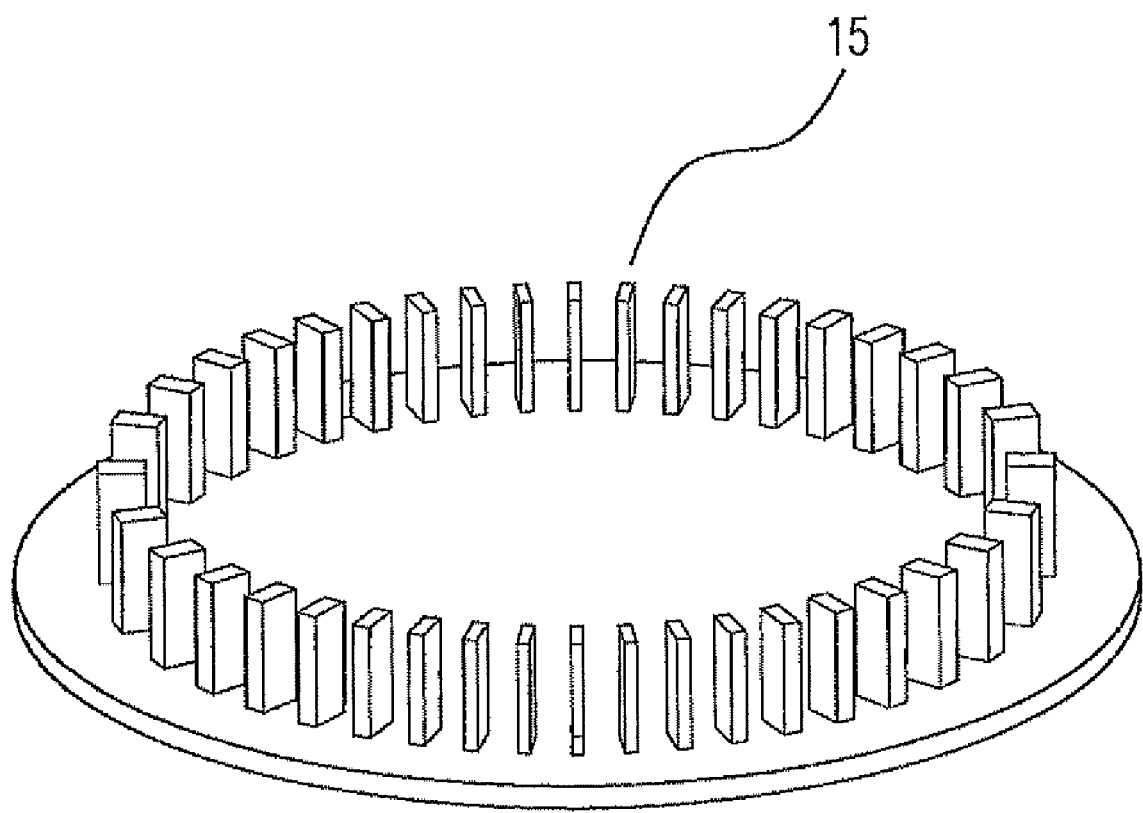
FIG. 3B is a diagram showing the ring structure formed in the present disclosure.

Please refer to FIGS. 1A, 1B, 2A and 2B, wherein FIG. 1A is a diagram showing the unit structure according to one exemplary embodiment, FIG. 1B is a diagram showing the 3-D corrugate structure according to one exemplary embodiment, FIG. 2A is a diagram showing the unit structure according to another exemplary embodiment, and FIG. 2B is a diagram showing the 3-D corrugate structure according to another exemplary embodiment. Each truss structure of the present invention includes a poly-silicon substrate 11 and plural truss structure units 12, which are formed by the combinations of the VIAs 121 and the metal layers 122 in different amounts and different arrangements. The plural truss structure units 12 are piled up on each other to form the 3-D corrugate structure 13, wherein the plural truss structure units 12 could be formed by the identically repeating combination or various combinations. The 3-D corrugate structures 13 are combined to form the individual supporting structure 14 as shown in FIG. 3A. Plural individual supporting structures 14 are combined to form the ring-shaped 3-D corrugate structure 15 on the poly-silicon substrate 11 as shown in FIG. 31B. Such ring-shaped 3-D corrugate structure 15 formed by the truss structure units 12 could be applied to the pressure sensing membrane, the characteristics of which is that the truss structure units 12 have more intra-space to make the 3-D corrugate structure 15 full of the elasticity to release the normal stress and the gradient stress.

To compare the stress releasing effect, the factor limited simulation program, Coventor Ware, is used to simulate the stress releasing effect of the round structure and in the 3-D corrugate structure formed by the truss structure of the present disclosure under the stress conditions of 100 Mpa and −100 Mpa respectively. The simulation result shows that if the 100 Mpa and −100 Mpa stresses are applied to the round structure, the mises stresses received thereby are respectively 99 Mpa and 100 Mpa. That is, no matter how many stresses are applied to the round structure, they are received by the round structure itself. However, if the 100 Mpa and −100 Mpa stresses are applied to the 3-D corrugate structure, the mises stresses received thereby are respectively 4 Mpa and 9 Mpa. Namely, most stresses applied to the 3-D corrugate structure are released. Therefore, such a low stress makes the pressure sensing membrane have high sensitivity.

Figure 4:
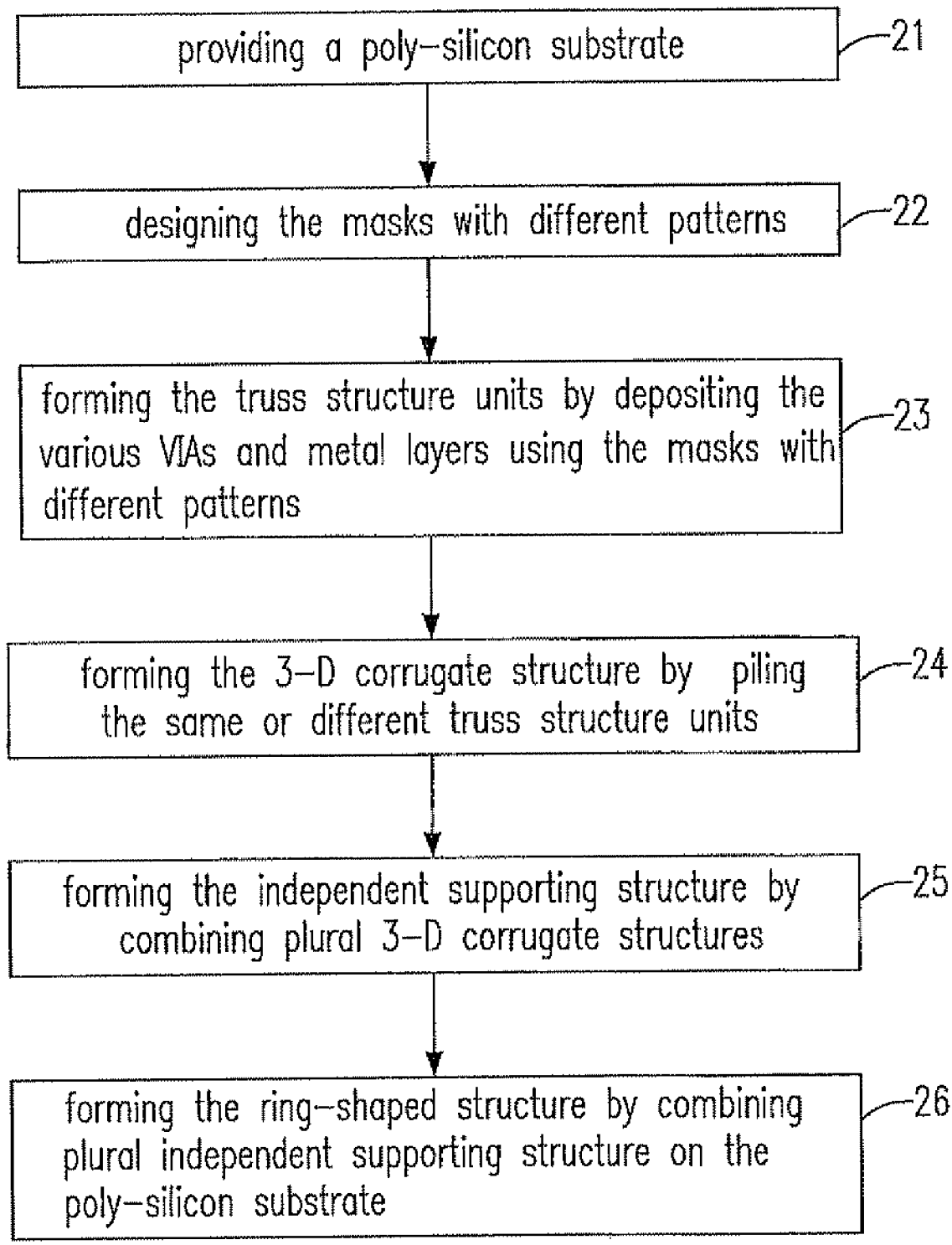
FIG. 4 is a flow chart of the method for manufacturing the truss structure in the present disclosure.

Please refer to FIG. 4, which shows a flow chart of the method for manufacturing the truss structure in the present disclosure. The truss structure of the present disclosure is made by a complex piling method, which includes steps of providing a poly-silicon substrate (step 21), designing the masks with different patterns (step 22), forming the truss structure units by depositing various VIAs and metal layers using the masks with different patterns (step 23), forming the 3-D corrugate structure by piling the same or different truss structure units (step 24), forming the independent supporting structure by combining plural 3-D corrugate structures (step 25), and forming the ring-shaped structure by combining plural independent supporting structures on the poly-silicon substrate (step 26).

Accordingly, the truss structure and the manufacturing method thereof in the present disclosure use the complex piling method to pile the truss structures designed in advance to form the 3-D corrugate structure. The truss structure and the manufacturing method thereof in the present disclosure not only sufficiently release the normal stress and the gradient stress in the manufacturing process of the membrane, but also simplify the manufacturing process to save the time and cost of exposure, development, etching, deposition, etc.

It will be apparent to those skilled in the art that various modifications and variations can be made in the truss structure and the manufacturing method thereof. It is to be understood that the invention needs not be limited to the disclosed exemplary embodiment. It is intended to cover various modifications and similar arrangements included within the spirit and scope of the appended claims which are to be accorded with the broadest interpretation so as to encompass all such modifications and similar structures.

What is claimed is:

1. A truss structure, comprising:
   a substrate: and
   a plurality of sub-truss groups disposed on the substrate, wherein each sub-truss group comprises
   a plurality of VIAs, and
   a plurality of metal layers interlaced with the plurality of VIAs;
   the plurality of sub-truss groups being piled up on each other to form a 3-D corrugate ring structure.

2. A truss structure as claimed in claim 1, wherein the plurality of sub-truss groups have an identical size and arrangement.

3. A truss structure as claimed in claim 1, wherein the plurality of sub-truss groups have different sizes and arrangements.

4. A truss structure as claimed in claim 1, wherein the plurality of VIAs and the plurality of metal layers comprise different materials.

5. A truss structure as claimed in claim 1, wherein the plurality of VIAs and the plurality of metal layers are formed by a deposition method.

6. A truss structure as claimed in claim 1, wherein the substrate comprises a pressure sensing membrane.

7. A truss structure as claimed in claim 6, wherein the pressure sensing membrane comprises poly-silicon.

8. A truss structure, comprising:
   a pressure sensing membrane; and
   a plurality of sub-truss structures disposed on the pressure sensing membrane, with the plurality sub-truss structures being piled up on each other to form a 3-D corrugate ring structure.

* * * * *